(12) United States Patent
Erturk et al.

(10) Patent No.: US 10,199,152 B2
(45) Date of Patent: Feb. 5, 2019

(54) EMBEDDED THIN FILM MAGNETIC CARRIER FOR INTEGRATED VOLTAGE REGULATOR

(71) Applicant: QUALCOMM Incorporated, San Diego, CA (US)

(72) Inventors: Mete Erturk, San Diego, CA (US); Ravindra Vaman Shenoy, Dublin, CA (US); Kwan-yu Lai, Campbell, CA (US); Jitae Kim, Mountain View, CA (US); Donald William Kidwell, Jr., Campbell, CA (US); Jon Bradley Lasiter, Stockton, CA (US); James Thomas Doyle, Carlsbad, CA (US); Omar James Bchir, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 404 days.

(21) Appl. No.: 14/743,623

(22) Filed: Jun. 18, 2015

(65) Prior Publication Data

US 2016/0163443 A1 Jun. 9, 2016

Related U.S. Application Data

(60) Provisional application No. 62/086,947, filed on Dec. 3, 2014.

(51) Int. Cl.
*H01F 5/00* (2006.01)
*H01F 27/28* (2006.01)
(Continued)

(52) U.S. Cl.
CPC ..... *H01F 27/2804* (2013.01); *H01F 1/14708* (2013.01); *H01F 5/00* (2013.01);
(Continued)

(58) Field of Classification Search
CPC ................. H01F 5/00; H01F 27/00–27/36
(Continued)

(56) References Cited

U.S. PATENT DOCUMENTS 5,070,317 A 12/1991 Bhagat
5,576,680 A 11/1996 Ling
(Continued)

FOREIGN PATENT DOCUMENTS

CN 103426859 A 12/2013
CN 104051459 A 9/2014

OTHER PUBLICATIONS

International Search Report and Written Opinion—PCT/US2015/059198—ISA/EPO—dated Mar. 3, 2016.

*Primary Examiner* — Tuyen Nguyen
(74) *Attorney, Agent, or Firm* — Muncy, Geissler, Olds & Lowe, P.C.

(57) ABSTRACT

An inductor can include a first substrate, a magnetic piece, and a conductor. The first substrate can be formed within a second substrate. The magnetic piece can be connected to a first side of the first substrate. The conductor can be formed within the second substrate, on the second substrate, or both. The conductor can have an input and an output. The conductor can be configured to surround the first substrate without being in contact with the first substrate and without being in contact with the magnetic piece.

12 Claims, 8 Drawing Sheets

(51) Int. Cl.

| | | |
|---|---|---|
| *H01F 1/147* | (2006.01) | |
| *H01F 27/24* | (2006.01) | |
| *H01F 41/02* | (2006.01) | |
| *H01F 41/14* | (2006.01) | |
| *H05K 1/11* | (2006.01) | |
| *H05K 1/18* | (2006.01) | |
| *H01F 17/00* | (2006.01) | |
| *H01F 41/04* | (2006.01) | |
| *H05K 1/16* | (2006.01) | |
| *H01L 23/64* | (2006.01) | |
| *H01L 23/00* | (2006.01) | |

(52) U.S. Cl.
CPC ......... *H01F 17/0033* (2013.01); *H01F 27/24* (2013.01); *H01F 41/02* (2013.01); *H01F 41/046* (2013.01); *H01F 41/14* (2013.01); *H01L 23/642* (2013.01); *H01L 23/645* (2013.01); *H05K 1/111* (2013.01); *H05K 1/165* (2013.01); *H05K 1/182* (2013.01); *H01F 2017/002* (2013.01); *H01F 2017/0066* (2013.01); *H01F 2027/2809* (2013.01); *H01L 24/16* (2013.01); *H01L 2224/16227* (2013.01); *H01L 2924/14* (2013.01); *H01L 2924/15192* (2013.01); *H01L 2924/15311* (2013.01); *H01L 2924/19041* (2013.01); *H05K 2201/10166* (2013.01)

(58) Field of Classification Search
USPC ................. 336/65, 84 R, 84 M, 200, 232
See application file for complete search history.

(56) References Cited

U.S. PATENT DOCUMENTS

| | | | | |
|---|---|---|---|---|
| 6,542,060 | B2* | 4/2003 | Fedeli | B82Y 25/00 336/174 |
| 7,107,666 | B2* | 9/2006 | Hiatt | H01F 17/0006 29/602.1 |
| 7,196,607 | B2* | 3/2007 | Pleskach | H01F 17/0033 257/E23.062 |
| 7,391,293 | B2* | 6/2008 | Snyder | H01F 41/042 336/200 |
| 7,449,987 | B2* | 11/2008 | Snyder | H01F 27/2804 336/200 |
| 8,313,659 | B2 | 11/2012 | Stadniychuk et al. | |
| 8,350,657 | B2 | 1/2013 | Derochemont et al. | |
| 8,754,737 | B2 | 6/2014 | Kin On Sin et al. | |
| 2002/0047769 | A1 | 4/2002 | Fedeli | |
| 2013/0075860 | A1 | 3/2013 | Kuo et al. | |
| 2013/0097443 | A1 | 4/2013 | Li et al. | |
| 2014/0104284 | A1 | 4/2014 | Shenoy et al. | |

\* cited by examiner

EMBEDDED THIN FILM MAGNETIC CARRIER FOR INTEGRATED VOLTAGE REGULATOR

CROSS-REFERENCE TO RELATED APPLICATION

The present Application for Patent claims priority to U.S. Provisional Patent Application No. 62/086,947, entitled "Embedded Thin Film Carrier for Integrated Voltage Regulator," filed Dec. 3, 2014 and assigned to the assignee hereof and hereby expressly incorporated by reference herein in its entirety.

INTRODUCTION

1. Field

Aspects disclosed herein relate generally to an embedded thin film magnetic carrier for an embedded inductor, and particularly, but not exclusively, to an embedded thin film magnetic carrier for an embedded inductor for an integrated voltage regulator.

2. Description of the Related Art

The reduction in feature sizes of active devices has enabled more active devices to be fabricated on an integrated circuit chip to process digital data. However, the reduction in feature sizes of active devices has also not only reduced the operating voltages of these devices, but has also narrowed the degree of deviation from nominal operating voltages that these devices can tolerate. Voltage regulators convert external power supply voltages (e.g., conventional alternating current voltages, batteries, etc.) to direct current (DC) voltages to be used by the active devices and to regulate these converted voltages.

Modern systems-on-a-chip (SOCs) typically have multiple power domains where each domain may require a different regulated voltage (e.g., 1.0V, 1.2V, 1.8V, etc.). This necessitates individual regulated voltage rails within the SOC for each DC level. Also, different domains with the same voltage level may require separate voltage regulation to enable the idling or powering down of a particular domain for power efficiency. While it is desirable to perform a single stage voltage regulation on the same die as the blocks that are being powered, this would consume considerable substrate area on an advanced node and may not be practical due to the relatively higher battery voltages and lack of transistors in advanced nodes that can handle these voltages. An alternative approach is to adopt a dual stage voltage regulation, where the first conversion (e.g., from a battery) happens externally, either within a dedicated power management integrated circuit (PMIC) or by utilizing discrete components, and a second stage conversion happens internal to the SOC. In such a dual stage approach, the net conversion efficiency is the product of the efficiencies of each of the stages. Therefore, each voltage regulation stage can be required to have very high efficiency to minimize power losses. Switching voltage regulators, or switched-mode power supplies (SMPSs), can have a higher efficiency than low dropout linear regulators (LDOs). However, implementation of SMPSs on SOC dies can be challenging because of the inductors and capacitors required for SMPS operation. This and other factors have presented obstacles to incorporating switching voltage regulators into processor chips.

In spite of the challenges mentioned above, having localized power domains with integrated voltage regulation is becoming a necessity due to the increasing number of power rails and increasing demand for power savings. Particularly for high current loads, as in a graphics operation, it is becoming impractical to manage voltage droops associated with changes in load current without localized voltage regulation.

SUMMARY

Features and utilities of aspects disclosed herein can be achieved by providing an inductor that can include a first substrate, a magnetic piece, and a conductor. The first substrate can be formed within a second substrate. The magnetic piece can be connected to a first side of the first substrate. The conductor can be formed within the second substrate, on the second substrate, or both. The conductor can have an input and an output. The conductor can be configured to surround the first substrate without being in contact with the first substrate and without being in contact with the magnetic piece.

Features and utilities of aspects disclosed herein can also be achieved by providing an inductor that includes means for supporting a magnet and means for conducting a current. The means for conducting the current can be configured to surround the means for supporting the magnet without being in contact with the means for supporting the magnet and without being in contact with the magnet.

Features and utilities of aspects disclosed herein can also be achieved by providing a semiconductor device that can include an inductor and an integrated circuit. The inductor can have a first substrate, a magnetic piece, and a conductor. The magnetic piece can be connected to a surface of the first substrate. The conductor can be configured to surround the first substrate without being in contact with the first substrate and without being in contact with the magnetic piece. The inductor can be embedded in a second substrate. The integrated circuit can be formed having a voltage regulator and a circuit. The integrated circuit can be connected to the second substrate. The circuit can be configured to receive a voltage from the voltage regulator. The voltage regulator can be connected to the inductor.

Features and utilities of aspects disclosed herein can also be achieved by providing a method for fabricating an inductor. A first magnetic piece can be formed connected to a first side of a first substrate. A second substrate can be formed to at least partially surround the first substrate. A conductor can be formed within the second substrate, on the second substrate, or both. The conductor can be formed to have an input and an output. The conductor can be formed to surround the first substrate without being in contact with the first substrate and without being in contact with the first magnetic piece.

BRIEF DESCRIPTION OF THE DRAWINGS

These and other sample aspects are described in the detailed description, the appended claims, and the accompanying drawings.

Figure 1:
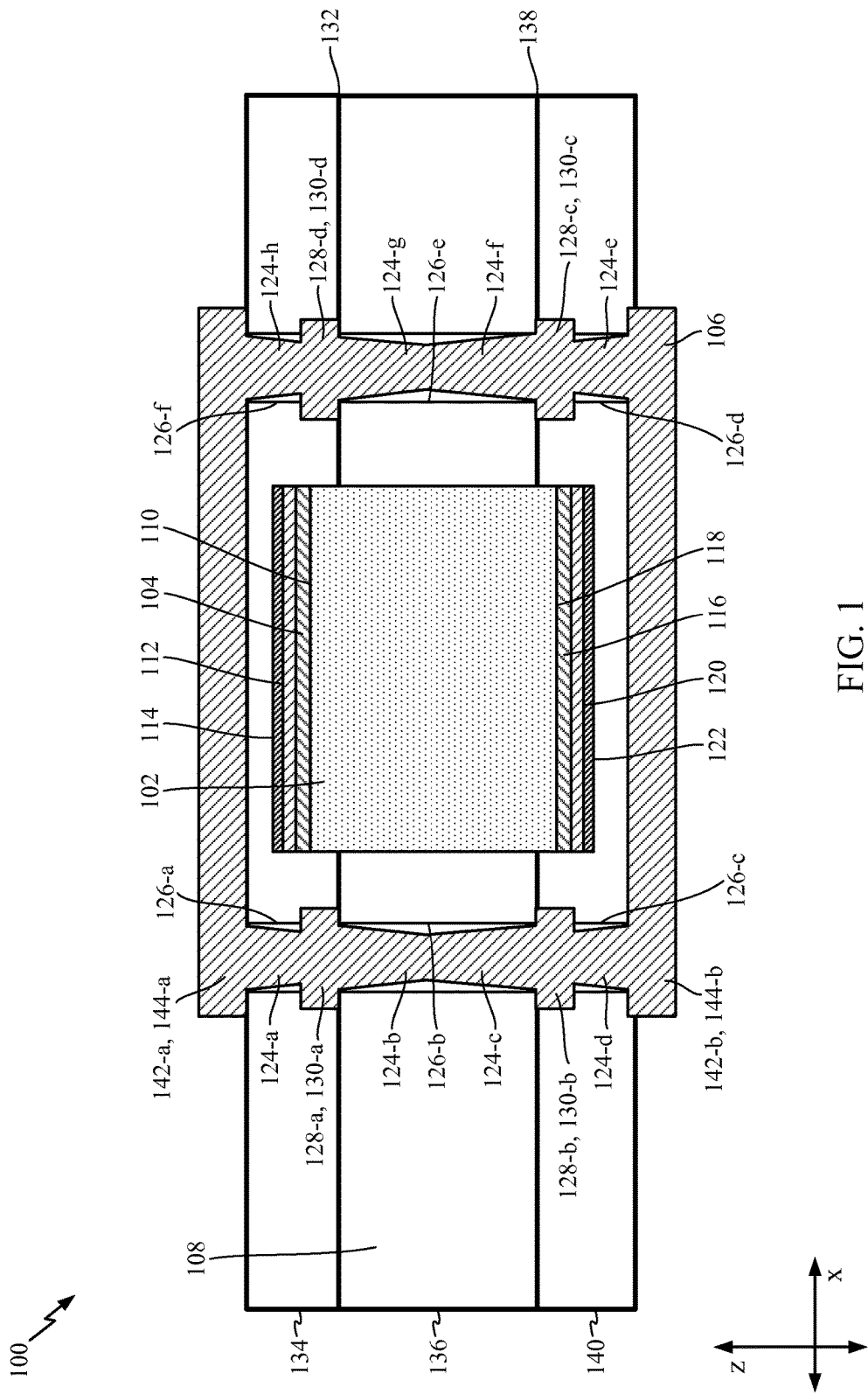
FIG. 1 is an exemplary block diagram of an exemplary inductor.

In accordance with common practice, various features illustrated in the drawings may not be drawn to scale. Accordingly, dimensions of the various features may be arbitrarily expanded or reduced for clarity. In addition, aspects illustrated in the drawings may be simplified for clarity. Thus, the drawings may not illustrate all of the components of a given apparatus or device. Finally, like reference numerals may be used throughout the specification and the drawings to denote like features.

DETAILED DESCRIPTION

Aspects disclosed herein relate generally to an embedded thin film magnetic first substrate for an embedded inductor, and particularly to an embedded thin film magnetic first substrate for an embedded inductor for an integrated voltage regulator.

The reduction in feature sizes of active devices has enabled more active devices to be fabricated on an integrated circuit chip to process digital data. However, the reduction in feature sizes of the active devices has also not only reduced the operating voltages of the active devices, but has also narrowed the degree of deviation from nominal operating voltages that the active devices can tolerate. Voltage regulators convert external power supply voltages (e.g., conventional alternating current voltages, batteries, etc.) to direct current (DC) voltages to be used by the active devices and to regulate these converted voltages.

Modern systems-on-a-chip (SOCs) typically have multiple power domains where each domain may require a different regulated voltage (e.g., 1.0V, 1.2V, 1.8V, etc.). This necessitates individual regulated voltage rails within the SOC for each DC level. Also, different domains with the same voltage level may require separate voltage regulation to enable the idling or powering down of a particular domain for power efficiency. While it is desirable to perform a single stage voltage regulation on the same die as the blocks that are being powered, this would consume considerable substrate area on an advanced node and may not be practical, due to the relatively higher battery voltages and lack of transistors in advanced nodes that can handle these voltages. An alternative approach is to adopt dual-stage voltage regulation, where the first conversion (e.g., from a battery) happens externally, either within a dedicated power management integrated circuit (PMIC) or by utilizing discrete components, and a second stage conversion happens internal to the SOC. In such a dual stage approach, the net conversion efficiency is the product of the efficiencies of each of the stages. Therefore, each voltage regulation stage can be required to have very high efficiency to minimize power losses. Switching voltage regulators, or switched-mode power supplies (SMPSs), can have a higher efficiency than low dropout linear regulators (LDOs). However, implementation of SMPSs on SOC dies can be challenging because of the inductors and capacitors required for SMPS operation. This and other factors have presented obstacles to incorporating switching voltage regulators into processor chips.

In spite of the challenges mentioned above, having localized power domains with integrated voltage regulation is becoming a necessity due to the increasing number of power rails and increasing demand for power savings. Particularly for high current loads, as in a graphics operation, it is becoming impractical to manage voltage droops associated with changes in load current without localized voltage regulation.

These problems can be addressed by providing an inductor that can include a first substrate, a first magnetic piece, and a conductor. The first substrate can be formed within a second substrate. The first magnetic piece can be connected to a first side of the first substrate. The conductor can be formed within the second substrate, on the second substrate, or both. The conductor can have an input and an output. The conductor can be configured to surround the first substrate without being in contact with the first substrate and without being in contact with the first magnetic piece.

FIG. 1 is an exemplary block diagram of an exemplary inductor 100. The block diagram of FIG. 1 illustrates the inductor 100 in an x-z plane. The inductor 100 can include a first substrate 102, a first magnetic piece 104, and a conductor 106. The first substrate 102 can be formed within a second substrate 108. The first magnetic piece 104 can be connected to a first side 110 of the first substrate 102. The conductor 106 can be formed within the second substrate 108, on the second substrate 108, or both. The conductor 106 can have an input 202 (see FIG. 2) and an output 204 (see FIG. 2). The conductor 106 can be configured to surround the first substrate 102 without being in contact with the first substrate 102 and without being in contact with the first magnetic piece 104.

Optionally, the first substrate 102 can be made of a material that includes a glass, a dielectric material, an organic material, a material that has a root mean square profile roughness parameter that is less than or equal to 100 Angstroms, or any combination of the foregoing. The first substrate 102 can be made of laminated layers.

The first substrate 102 can be a carrier. The second substrate 108 can be a package substrate. Optionally, the first substrate 102 can be made of a first material, the second substrate 108 can be made of a second material, and the second material can be different from the first material.

Optionally, the first magnetic piece 104 can be made of a material that includes at least one of cobalt tantalum zirconium, cobalt iron, nickel iron alloys (particularly 80 percent nickel and 20 percent iron or 45 percent nickel and 55 percent iron), or the like, or any of the foregoing. Optionally, the first magnetic piece 104 can be made of a material with additional trace components of at least one of carbon, boron, phosphorous, tungsten, or the like to increase resistivity of the first magnetic piece 104.

Optionally, the conductor 106 can be made of a material that includes copper.

Optionally, the inductor 100 can also include a first dielectric piece 112 and a second magnetic piece 114. The first dielectric piece 112 can be connected to the first magnetic piece 104. The second magnetic piece 114 can be connected to the first dielectric piece 112. Advantageously, the first dielectric piece 112 and the second magnetic piece 114 can act to increase the strength of the magnetic field. Additional layers of dielectric pieces and magnetic pieces can also be included on the first side 110.

Optionally, the inductor 100 can also include a third magnetic piece 116. The third magnetic piece 116 can be connected to a second side 118 of the first substrate 102. The second side 118 can be opposite of the first side 110. Advantageously, the third magnetic piece 116 can act to increase the strength of the magnetic field.

Optionally, the inductor 100 can also include a second dielectric piece 120 and a fourth magnetic piece 122. The second dielectric piece 120 can be connected to the third magnetic piece 116. The fourth magnetic piece 122 can be connected to the third dielectric piece 116. Advantageously, the second dielectric piece 120 and the fourth magnetic piece 122 can act to increase the strength of the magnetic field. Additional layers of dielectric pieces and magnetic pieces can also be included on the second side 118.

A simulation has demonstrated that the inductance can be increased by a factor of 2.3 when the inductor 100 includes both the first magnetic piece 104 and the second magnetic piece 114, as well as both the third magnetic piece 116 and the fourth magnetic piece 122.

In an aspect, multiple occurrences of the inductor 100 can be used. For example, to minimize an area consumed when multiple occurrences of the inductor 100 are used, each inductor 100 of the multiple occurrences of the inductor 100 can be arranged adjacent to another inductor 100 of the multiple occurrences of the inductor 100 along the z-axis. For example, to reduce an overall direct current resistance associated with multiple occurrences of the inductor 100, each inductor 100 of the multiple occurrences of the inductor 100 can be arranged adjacent to another inductor 100 of the multiple occurrences of the inductor 100 along the x-axis or along a y-axis (see FIG. 2).

In an aspect, at least one first portion 124 of the conductor 106 can be formed at at least one via 126 of the second substrate 108. For example, the inductor 100 illustrated at FIG. 1 can include at least one first portion 124-*a* through 124-*h* of the conductor 106 formed at at least one via 126-*a* through 126-*f* of the second substrate 108.

In an aspect, at least one second portion 128 of the conductor 106 can be formed as at least one conduction pad 130. The at least one conduction pad 130 can be formed at a junction 132 of a first layer 134 of the second substrate 108 with a second layer 136 of the second substrate 108. For example, the inductor 100 illustrated at FIG. 1 can include at least one second portion 128-*a* through 128-*d* of the conductor 106 formed as at least one conduction pad 130-*a* through 130-*d*. The at least one conduction pad 130-*a* through 130-*d* can be formed at the junction 132 of the first layer 134 of the second substrate 108 with the second layer 136 of the second substrate 108 and at a junction 138 of the second layer 136 of the second substrate 108 with a third layer 140 of the second substrate 108.

In an aspect, at least one third portion 142 of the conductor 106 can be formed as at least one interconnect 144 within the second substrate 108, on the second substrate 108, or both. For example, the inductor 100 illustrated at FIG. 1 can include at least one third portion 142-*a* and 142-*b* formed as at least one interconnect 144-*a* and 144-*b* on the second substrate 108.

Figure 2:
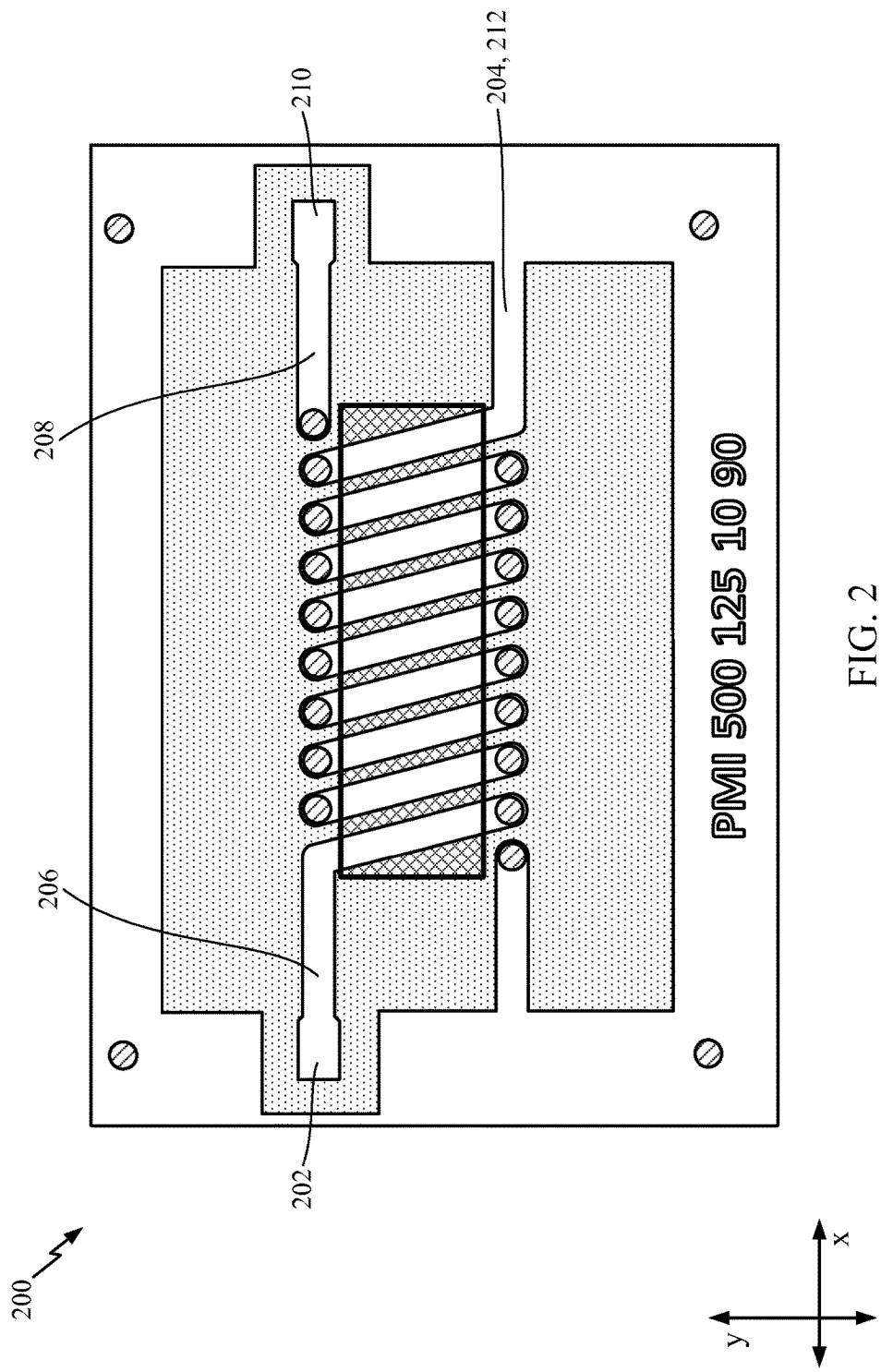
FIG. 2 is an exemplary picture of an exemplary inductor formed in a manner similar to the exemplary inductor illustrated in FIG. 1.

FIG. 2 is an exemplary picture of an exemplary inductor 200 formed in a manner similar to the inductor 100. FIG. 2 illustrates the two inductors 200 in an x-y plane. The two inductors 200 can include a first inductor 206 and a second inductor 208. The two inductors 200 can be configured as a solenoid. The first inductor 206 can have the input 202 and the output 204. The output 204 can be ground. The second inductor 208 can have an input 210 and an output 212. The output 212 can be ground. The output 212 can be the output 204. The first inductor 206 can be configured to be magnetically coupled to the second inductor 208. Magnetic coupling between the first inductor 206 and the second inductor 208 can increase an effective inductance of the two inductors 200 as compared with a configuration which the first inductor 206 is not magnetically coupled to the second inductor 208. Further, magnetic coupling between the first inductor 206 and the second inductor 208 can reduce inductor ripple, reduce a switching frequency, and improve device efficiency.

Figure 3:
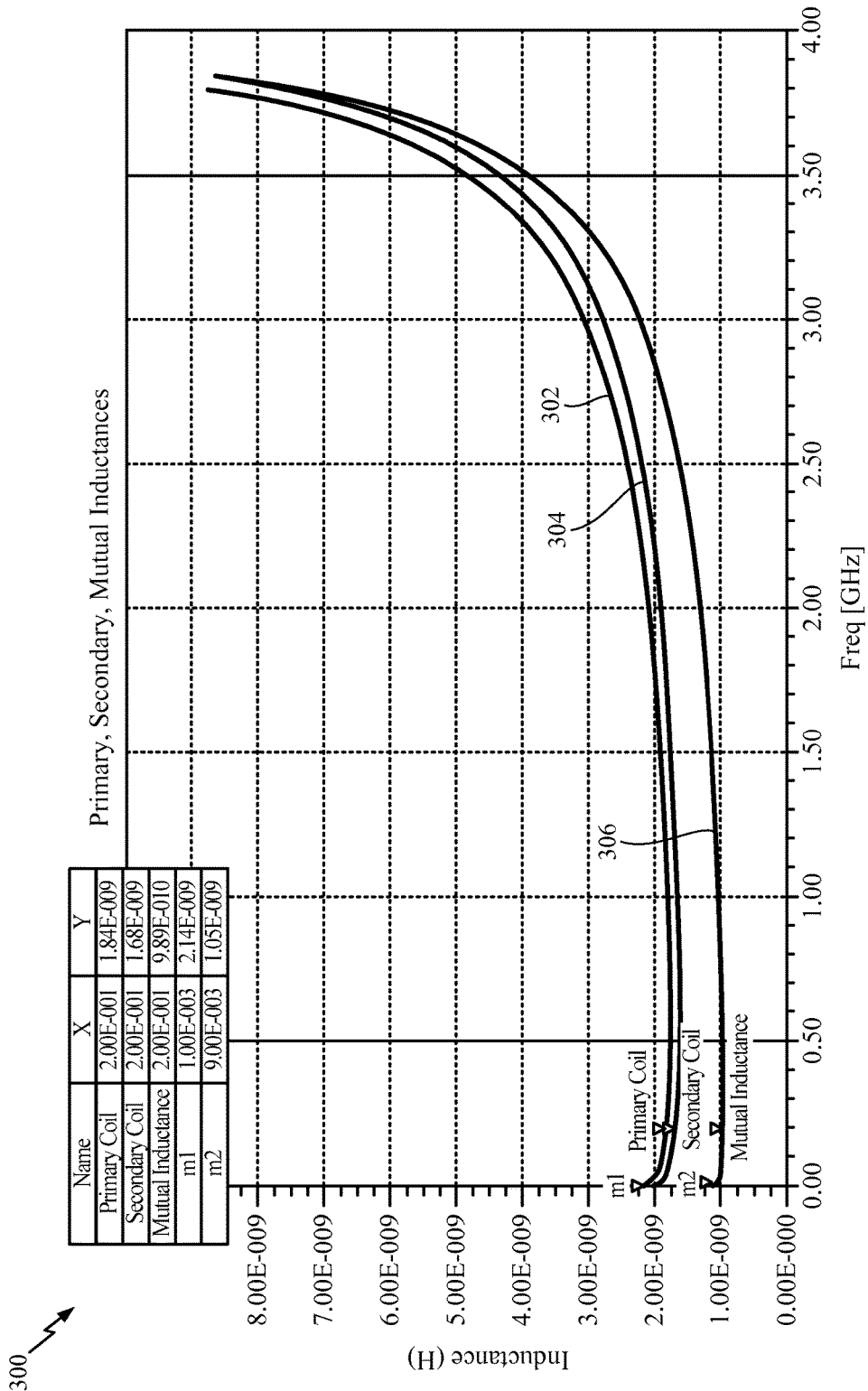
FIG. 3 is an exemplary graph of inductance versus frequency for an inductor formed with two coils in a manner similar to the exemplary inductor illustrated in FIG. 2, but without the magnetic pieces.

FIG. 3 is an exemplary graph 300 of inductance versus frequency for an inductor formed with two coils in a manner similar to the inductor 200, but without the magnetic pieces 104, 114, 116, and 122. The graph 300 includes a plot 302 for the primary coil, a plot 304 for the secondary coil, and a plot 306 for mutual inductance between the primary coil and the secondary coil.

Figure 4:
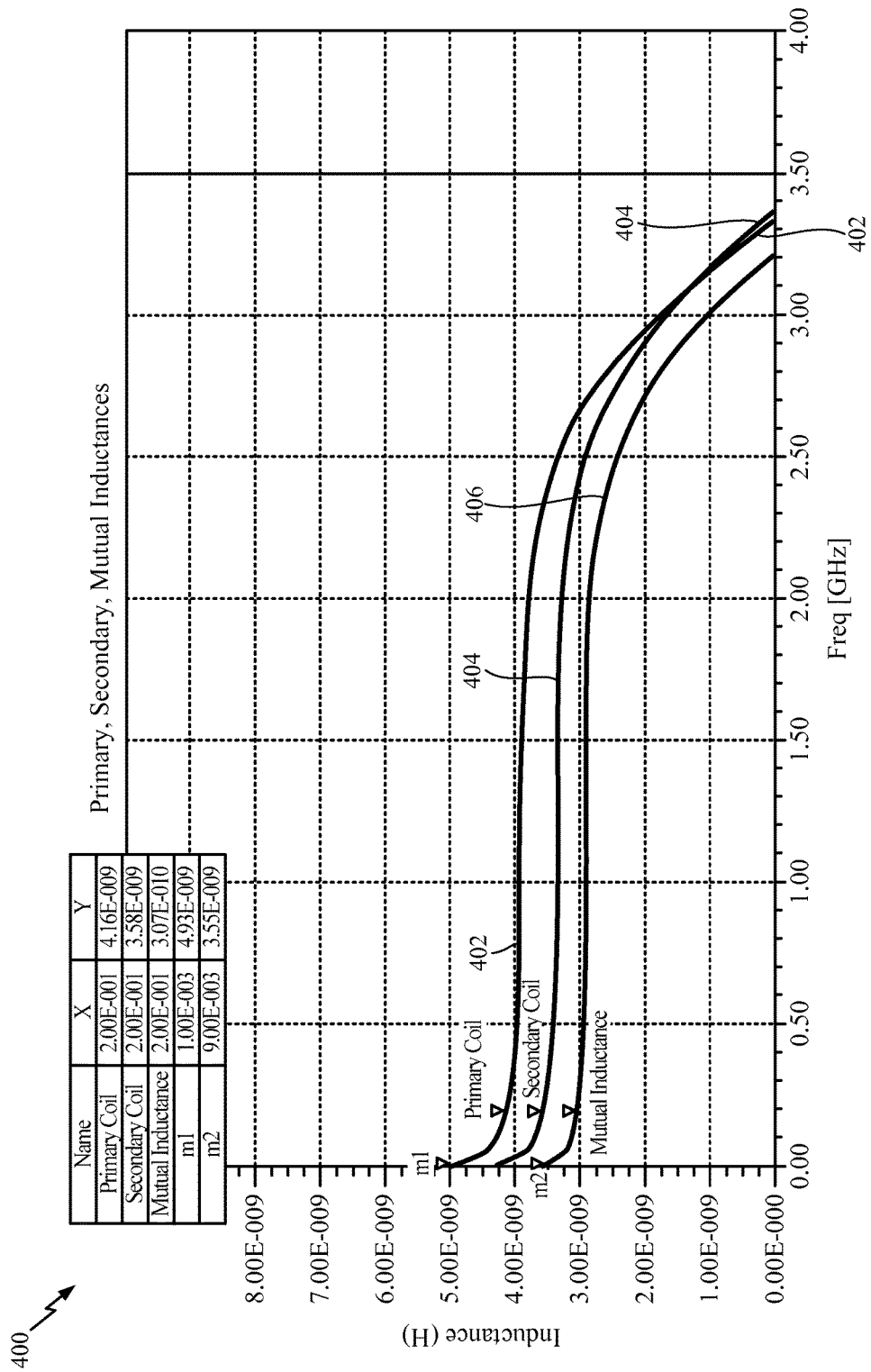
FIG. 4 is an exemplary graph of inductance versus frequency for an exemplary inductor formed with two coils in a manner similar to the exemplary inductor illustrated in FIG. 2, including the magnetic pieces.

FIG. 4 is an exemplary graph 400 of inductance versus frequency for an exemplary inductor formed with two coils in a manner similar to the inductor 200 including the magnetic pieces 104, 114, 116, and 122. The graph 400 includes a plot 402 for the primary coil, a plot 404 for the secondary coil, and a plot 406 for mutual inductance between the primary coil and the secondary coil.

Both the graph 300 and the graph 400 illustrate that the inductance versus frequency plots are smooth curves. The smooth curves do not have an undulation with frequency that occurs with inductance versus frequency for a conventional inductor that is fabricated separately from a substrate upon which a chip that processes data is mounted. Additionally, the graph 400 illustrates that there is minimal frequency roll-off.

Figure 5:
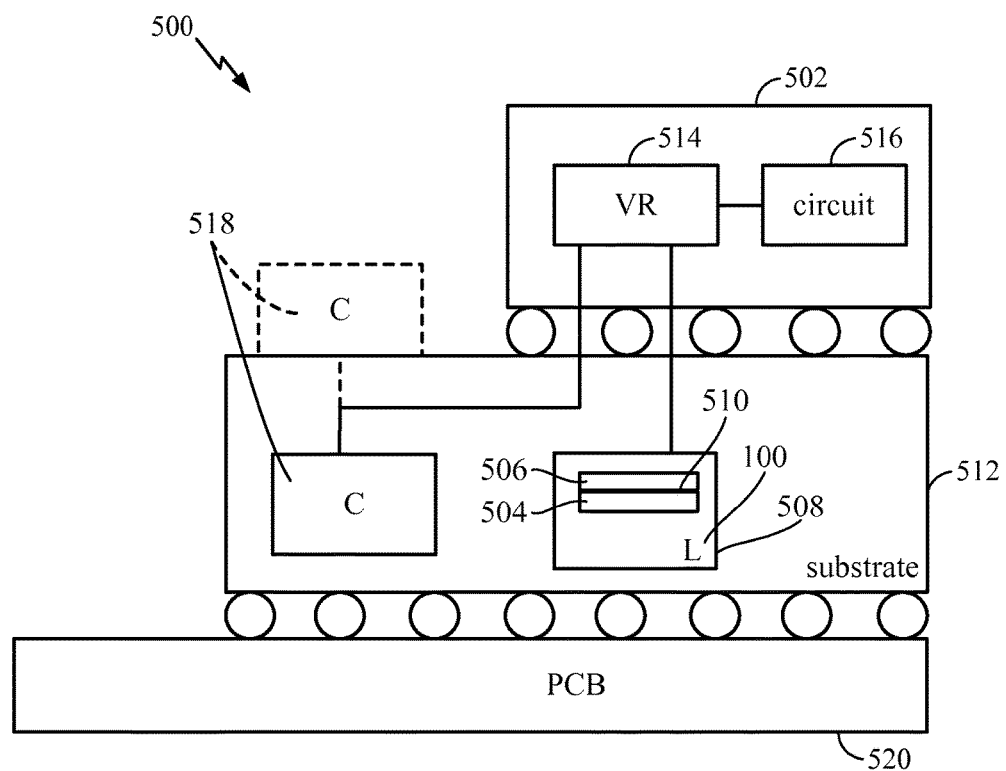
FIG. 5 is an exemplary block diagram of an exemplary semiconductor device that includes the exemplary inductor as illustrated in FIG. 1.

FIG. 5 is an exemplary block diagram of an exemplary semiconductor device 500 that includes the inductor 100. The semiconductor device 500 can include the inductor 100 and an integrated circuit 502. The inductor 100 can include a first substrate 504, a magnetic piece 506, and a conductor 508. The magnetic piece 506 can be connected to a surface 510 of the first substrate 504. The conductor 508 can be configured to surround the first substrate 504 without being in contact with the first substrate 504 and without being in contact with the magnetic piece 506. The inductor 100 can be embedded in a second substrate 512. The integrated circuit 502 can be formed having a voltage regulator 514 and a circuit 516. The integrated circuit 502 can be connected to the second substrate 512. The circuit 516 can be configured to receive a voltage from the voltage regulator 514. The voltage regulator 514 can be connected to the inductor 100.

The first substrate 504 can be made of a material that includes a glass, a dielectric material, an organic material, a material having a root mean square profile roughness parameter that is less than or equal to 100 Angstroms, or any combination of the foregoing. The first substrate 504 can be made of laminated layers.

The first substrate 504 can be a carrier. The second substrate 512 can be a package substrate. Optionally, the first substrate 504 can be made of a first material, the second substrate 512 can be made of a second material, and the second material can be different from the first material.

Optionally, the semiconductor device 500 can include a capacitor 518. The capacitor 518 can be embedded in the second substrate 512. Alternatively, the capacitor 518 can be connected to the second substrate 512. The capacitor 518 can be connected to the voltage regulator 514.

Optionally, the second substrate 512 can be configured to be connected to a printed circuit board (PCB) 520.

Figure 6:
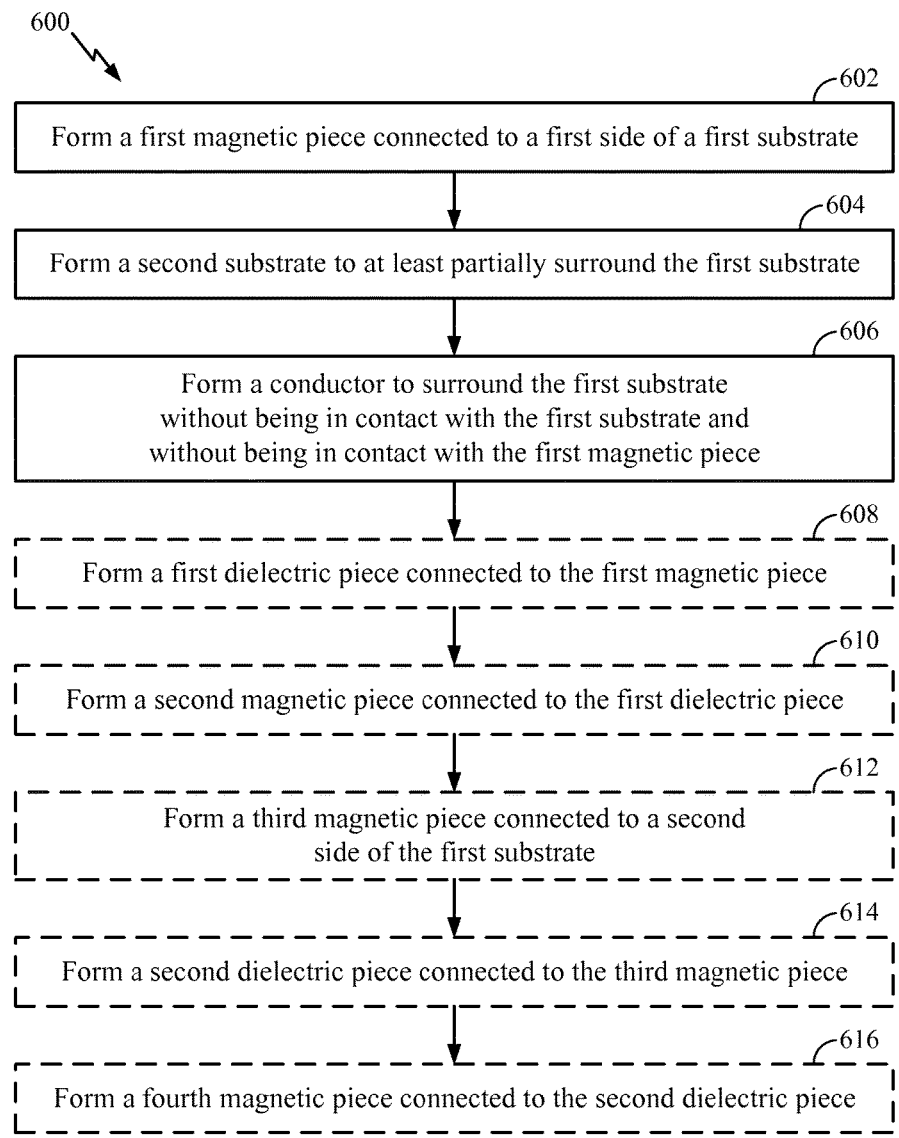
FIG. 6 is an exemplary flow diagram of an exemplary method for fabricating an exemplary inductor.

FIG. 6 is an exemplary flow diagram of an exemplary method 600 for fabricating an exemplary inductor. In the method 600, at an operation 602, a first magnetic piece can be formed connected to a first side of a first substrate. At an operation 604, a second substrate can be formed to at least partially surround the first substrate. At an operation 606, a conductor can be formed to surround the first substrate without being in contact with the first substrate and without being in contact with the first magnetic piece. The conductor can be formed within the second substrate, on the second substrate, or both. The conductor can have an input and an output.

Optionally, the first substrate can be made of a material that includes a glass, a dielectric material, an organic material, a material that has a root mean square profile roughness parameter that is less than or equal to 100 Angstroms, or any combination of the foregoing. The first substrate can be made of laminated layers.

The first substrate can be a carrier. The second substrate can be a package substrate. Optionally, the first substrate can be made of a first material, the second substrate can be made of a second material, and the second material can be different from the first material.

Optionally, the first magnetic piece can be made of a material that includes at least one of cobalt tantalum zirconium, cobalt iron, nickel iron alloys (particularly 80 percent nickel and 20 percent iron or 45 percent nickel and 55 percent iron), or the like, or any of the foregoing. Optionally, the first magnetic piece can be made of a material with additional trace components of at least one of carbon, boron, phosphorous, tungsten, or the like to increase resistivity of the first magnetic piece.

Optionally, the conductor can be made of a material that includes copper.

Optionally, at an operation 608, a first dielectric piece can be formed connected to the first magnetic piece.

Optionally, at an operation 610, a second magnetic piece can be formed connected to the first dielectric piece.

Optionally, at an operation 612, a third magnetic piece can be formed connected to a second side of the first substrate.

Optionally, at an operation 614, a second dielectric piece can be formed connected to the third magnetic piece.

Optionally, at an operation 616, a fourth magnetic piece can be formed connected to the second dielectric piece.

Figure 7:
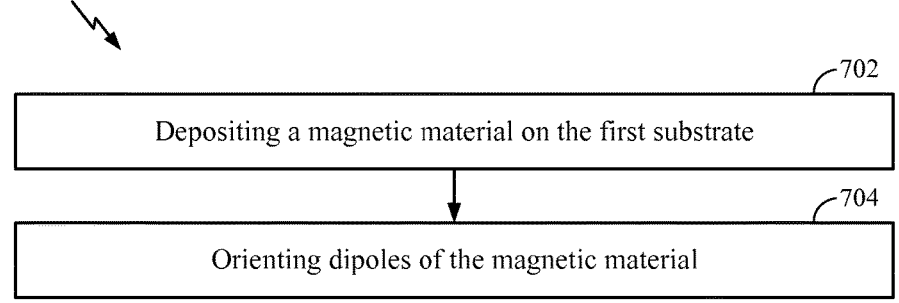
FIG. 7 is an exemplary flow diagram of an exemplary method for forming an exemplary magnetic piece.

FIG. 7 is an exemplary flow diagram of the operation 602 for forming an exemplary magnetic piece. In the operation 602, at an operation 702, a magnetic material can be deposited on the first substrate. At an operation 704, dipoles of the magnetic material can be oriented. Orientation of the dipoles can occur, for example, during a deposition process or an annealing process. The dipoles can be oriented, for example, to be aligned parallel to a direction of a magnetic field produced in response to a current flowing through the conductor.

Figure 8:
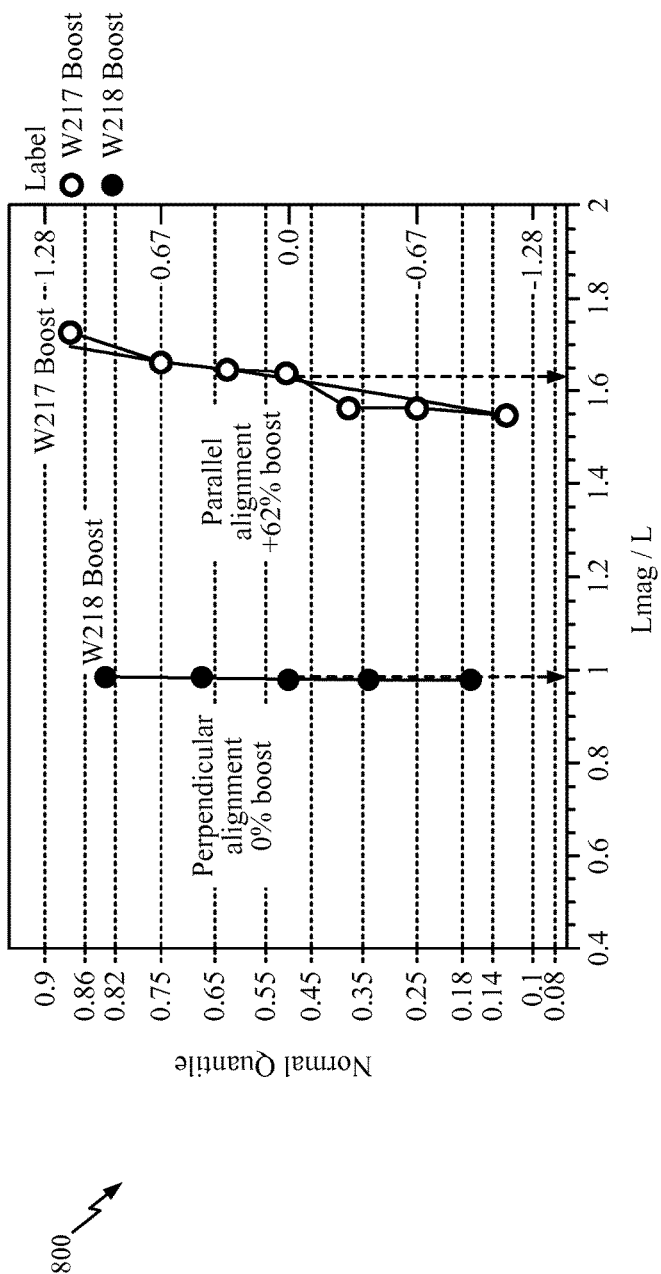
FIG. 8 is an exemplary graph of a normalized increase in inductance as a function of a direction of orientation of dipoles.

FIG. 8 is an exemplary graph 800 of a normalized increase in inductance as a function of a direction of orientation of the dipoles. The graph 800 illustrates the advantage of having the direction of orientation of the dipoles being aligned parallel to the direction of the magnetic field produced in response to the current flowing through the conductor as compared with being aligned perpendicular to the direction of the magnetic field produced in response to the current flowing through the conductor.

Figure 9:
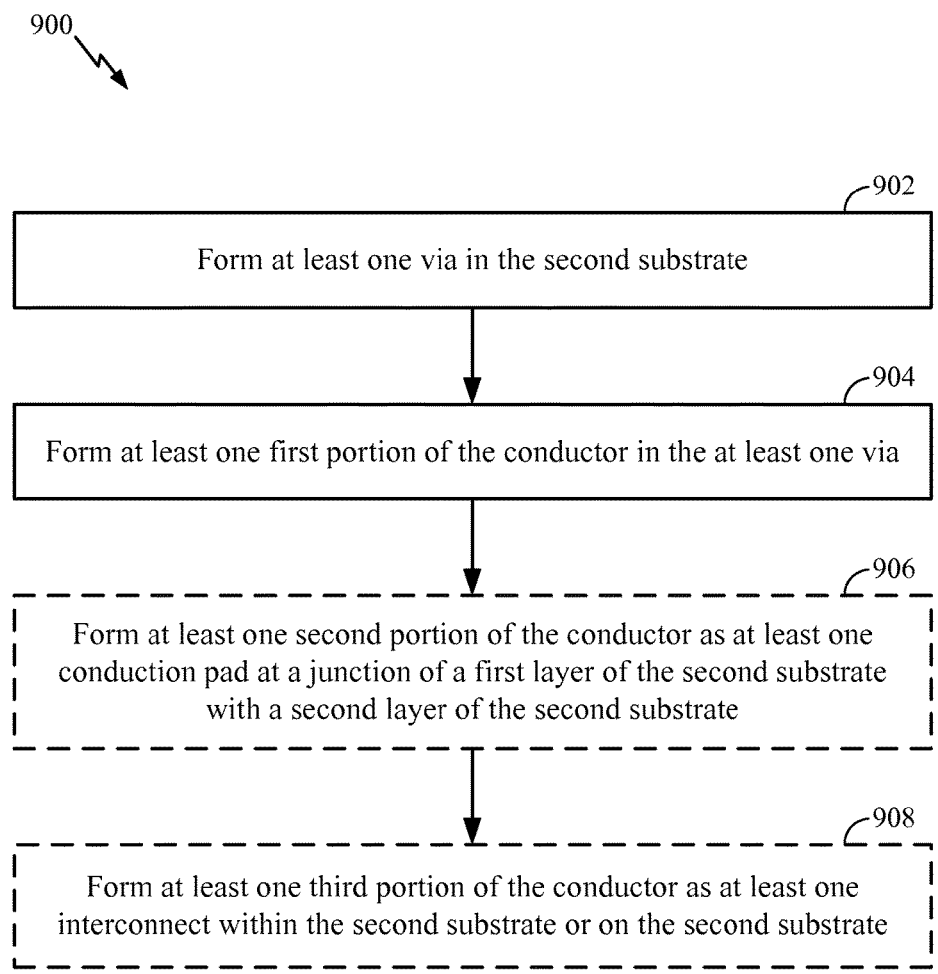
FIG. 9 is an exemplary flow diagram of an exemplary method for forming a conductor.

FIG. 9 an exemplary flow diagram of the operation 606 for forming a conductor. In the operation 606, at an operation 902, at least one via can be formed in the second substrate. At an operation 904, at least one first portion of the conductor can be formed in the at least one via. Optionally, at an operation 906, at least one second portion of the conductor can be formed as at least one conduction pad. The at least one conduction pad can be formed at a junction of a first layer of the second substrate with a second layer of the second substrate. Optionally, at an operation 908, at least one third portion of the conductor can be formed as at least one interconnect. The at least one interconnect can be formed within the second substrate, on the second substrate, or both.

The present Application for Patent is related to the following co-pending U.S. Patent Application: U.S. application Ser. No. 14/497,942, entitled "INDUCTOR SYSTEM FOR MULTI-PHASE POWER MANAGEMENT INTEGRATED CIRCUITS," filed Sep. 26, 2014, assigned to the assignee hereof, and expressly incorporated herein in its entirety by reference.

As used herein, the term "exemplary" means "serving as an example, instance, or illustration." Any example described as "exemplary" is not necessarily to be construed as preferred or advantageous over other examples. Likewise, the term "examples" does not require that all examples include the discussed feature, advantage, or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," and any variant thereof, mean any connection or coupling between elements, either direct or indirect, and can encompass a presence of an intermediate element between two elements that are "connected" or "coupled" together via the intermediate element. Coupling and connection between the elements can be physical, logical, or a combination thereof. Elements can be "connected" or "coupled" together, for example, by using one or more wires, cables, printed electrical connections, electromagnetic energy, and the like. The electromagnetic energy can have a wavelength at a radio frequency, a microwave frequency, a visible optical frequency, an invisible optical frequency, and the like, as practicable. These are several non-limiting and non-exhaustive examples.

The term "signal" can include any signal such as a data signal, an audio signal, a video signal, a multimedia signal, an analog signal, a digital signal, and the like. Information and signals described herein can be represented using any of a variety of different technologies and techniques. For example, data, an instruction, a process step, a process block, a command, information, a signal, a bit, a symbol, and the like that are references herein can be represented by a voltage, a current, an electromagnetic wave, a magnetic field, a magnetic particle, an optical field, and optical particle, and/or any practical combination thereof, depending at least in part on the particular application, at least in part on the desired design, at least in part on the corresponding technology, and/or at least in part on like factors.

A reference using a designation such as "first," "second," and so forth does not limit either the quantity or the order of those elements. Rather, these designations are used as a convenient method of distinguishing between two or more elements or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" or "one or more of A, B, or C" or "at least one of the group consisting of A, B, and C" used in the description or the claims can be interpreted as "A or B or C or any combination of these elements." For example, this terminology can include A, or B, or C, or (A and B), or (A and C), or (B and C), or (A and B and C), or 2A, or 2B, or 2C, and so on.

The terminology used herein is for the purpose of describing particular examples only and is not intended to be limiting. As used herein, the singular forms "a," "an," and "the" include the plural forms as well, unless the context clearly indicates otherwise. Further, the terms "comprises," "comprising," "includes," and "including," specify a presence of a feature, an integer, a step, a block, an operation, an element, a component, and the like, but do not necessarily preclude a presence or an addition of another feature, integer, step, block, operation, element, component, and the like.

In at least one example, the provided apparatuses can be a part of, and/or coupled to, an electronic device such as, but not limited to, at least one of a mobile device, a navigation device (e.g., a global positioning system receiver), a wireless device a camera, an audio player, a camcorder, and a game console.

The term "mobile device" can describe, and is not limited to, at least one of a mobile phone, a mobile communication device, a pager, a personal digital assistant, a personal information manager, a personal data assistant, a mobile hand-held computer, a portable computer, a tablet computer, a wireless device, a wireless modem, other types of portable electronic devices typically carried by a person and having communication capabilities (e.g., wireless, cellular, infrared, short-range radio, etc.), and/or any other device that is capable of receiving wireless communication signals used in determining a position fix. Further, the terms "user equipment" (UE), "mobile terminal," "user device," "mobile device," and "wireless device" can be interchangeable.

Further, those of skill in the art will appreciate that the exemplary logical blocks, modules, circuits, and steps described in the examples disclosed herein can be implemented as electronic hardware, computer software, or combinations of both, as practicable. To clearly illustrate this interchangeability of hardware and software, exemplary components, blocks, modules, circuits, and steps have been described herein generally in terms of their functionality. Whether such functionality is implemented as hardware or software depends upon the particular application and design constraints imposed on an overall system. Skilled artisans can implement the described functionality in different ways for each particular application, but such implementation decisions should not be interpreted as causing a departure from the scope of the present disclosure.

At least a portion of the methods, sequences, and/or algorithms described in connection with the examples disclosed herein can be embodied directly in hardware, in software executed by a processor (e.g., a processor described hereby), or in a combination of the two. In an example, a processor includes multiple discrete hardware components. A software module can reside in a storage medium (e.g., a memory device), such as a random-access memory (RAM), a flash memory, a read-only memory (ROM), an erasable programmable read-only memory (EPROM), an electrically erasable programmable read-only memory (EEPROM), a register, a hard disk, a removable disk, a compact disc read-only memory (CD-ROM), a Subscriber Identity Module (SIM) card, a Universal Subscriber Identity Module (USIM) card, and/or any other form of storage medium. An exemplary storage medium (e.g., a memory device) can be coupled to the processor such that the processor can read information from, and/or write information to, the storage medium. In an example, the storage medium can be integral with the processor.

Further, examples provided hereby are described in terms of sequences of actions to be performed by, for example, elements of a computing device. The actions described herein can be performed by a specific circuit (e.g., an application specific integrated circuit (ASIC)), by program instructions being executed by one or more processors, or by a combination of both. Additionally, a sequence of actions described herein can be considered to be entirely within any form of computer readable storage medium having stored therein a corresponding set of computer instructions that, upon execution, would cause an associated processor (such as a special-purpose processor) to perform at least a portion of a function described herein. Thus, examples may be in a number of different forms, all of which have been contemplated to be within the scope of the disclosure. In addition, for each of the examples described herein, a corresponding electrical circuit of any such examples may be described herein as, for example, "logic configured to" perform a described action.

The disclosed devices and methods can be designed and can be configured into a computer-executable file that is in a Graphic Database System Two (GDSII) compatible format, an Open Artwork System Interchange Standard (OASIS) compatible format, and/or a GERBER (e.g., RS-274D, RS-274X, etc.) compatible format, which can be stored on a non-transitory (i.e., a non-transient) computer-readable media. The file can be provided to a fabrication handler who fabricates with a lithographic device, based on the file, an integrated device. Deposition of a material to form at least a portion of a structure described herein can be performed using deposition techniques such as physical vapor deposition (PVD, e.g., sputtering), plasma-enhanced chemical vapor deposition (PECVD), thermal chemical vapor deposition (thermal CVD), and/or spin-coating, and the like. Etching of a material to form at least a portion of a structure described herein can be performed using etching techniques such as plasma etching. In an example, the integrated device is on a semiconductor wafer. The semiconductor wafer can be cut into a semiconductor die and packaged into a semiconductor chip. The semiconductor chip can be employed in a device described herein (e.g., a mobile device, an access device, and/or the like).

At least one example provided hereby can include a non-transitory (i.e., a non-transient) machine-readable media and/or a non-transitory (i.e., a non-transient) computer-readable media storing processor-executable instructions configured to cause a processor (e.g., a special-purpose processor) to transform the processor and any other cooperating devices into a machine (e.g., a special-purpose processor) configured to perform at least a part of a function described hereby and/or a method described hereby. Performing at least a part of a function described hereby can include initiating at least a part of a function described hereby. A non-transitory (i.e., a non-transient) machine-readable media specifically excludes a transitory propagating signal. Further, at least one embodiment of the invention can include a computer readable media embodying at least a part of a method described herein. Accordingly, any means for performing the functions described herein are included in at least one embodiment of the invention. A non-transitory (i.e., a non-transient) machine-readable media specifically excludes a transitory propagating signal.

Nothing stated or depicted in this application is intended to dedicate any component, step, block, feature, object, benefit, advantage, or equivalent to the public, regardless of whether the component, step, block, feature, object, benefit, advantage, or the equivalent is recited in the claims.

While the foregoing description provides illustrative aspects of the aspects disclosed herein, it is noted that various changes and modifications can be made to these illustrative implementations without departing from the scope defined by the appended claims.

What is claimed is:

1. An inductor, comprising:
    a first substrate formed within a second package substrate;
    a first magnetic piece connected to a first side of the first substrate;
    a second magnetic piece connected to a second side of the first substrate, the second side opposite of the first side; and
    a conductor formed at least one of within the second package substrate or on the second package substrate, with an input and an output, and configured to surround the first substrate without being in contact with the first substrate and without being in contact with the first magnetic piece or the second magnetic piece, wherein at least one first portion of the conductor is formed in at least one via of the second package substrate.

2. The inductor of claim 1, wherein the first substrate is made of a material comprising a glass.

3. The inductor of claim 1, wherein the first substrate is made of a dielectric material.

4. The inductor of claim 1, wherein the first substrate is made of an organic material.

5. The inductor of claim 1, wherein the first substrate is made of a first material and the second package substrate is made of a second material, the second material different from the first material.

6. The inductor of claim 1, wherein the first substrate is made of a material having a root mean square profile roughness parameter that is less than or equal to 100 Angstroms.

7. The inductor of claim 1, wherein the first magnetic piece is made of a material comprising at least one of cobalt tantalum zirconium, cobalt iron, or a nickel iron alloy.

8. The inductor of claim 1, further comprising:
    a dielectric piece connected to the first magnetic piece; and
    a third magnetic piece connected to the dielectric piece.

9. The inductor of claim 1, wherein the second magnetic piece is made of a material comprising at least one of cobalt tantalum zirconium, cobalt iron, or a nickel iron alloy.

10. The inductor of claim 1, wherein at least one second portion of the conductor is formed as at least one conduction pad, the at least one conduction pad formed at a junction of a first layer of the second package substrate with a second layer of the second package substrate.

11. The inductor of claim 10, wherein at least one third portion of the conductor is formed as at least one interconnect at least one of within the second package substrate or on the second package substrate.

12. An inductor, comprising:
    means for supporting a magnet formed within a package substrate; and
    means for conducting a current, the means for conducting the current configured to surround the means for supporting the magnet without being in contact with the means for supporting the magnet and without being in contact with the magnet wherein at least one first portion of the means for conducting is formed in at least one via of the package substrate.

* * * * *